United States Patent
Tepman et al.

[11] Patent Number: 5,907,220
[45] Date of Patent: May 25, 1999

[54] MAGNETRON FOR LOW PRESSURE FULL FACE EROSION

[75] Inventors: Avi Tepman, Cupertino; James van Gogh, Sunnyvale, both of Calif.

[73] Assignee: Applied Materials, Inc., Santa Clara, Calif.

[21] Appl. No.: 08/615,771

[22] Filed: Mar. 13, 1996

[51] Int. Cl.$^6$ ................................................. C23C 14/34
[52] U.S. Cl. ............................... 315/111.41; 204/298.07; 204/298.08; 204/298.2
[58] Field of Search ..................... 315/111.21, 111.31, 315/111.41, 111.71, 111.81, 111.91; 204/192.12, 192.13, 298.19, 298.2, 298.08, 298.07

[56] References Cited

U.S. PATENT DOCUMENTS

| | | | |
|---|---|---|---|
| 4,035,655 | 7/1977 | Guernet et al. | 250/492 A |
| 4,309,266 | 1/1982 | Nakamura et al. | . |
| 4,500,408 | 2/1985 | Boys et al. | . |
| 4,581,260 | 4/1986 | Mawla | 427/443.1 |
| 4,714,536 | 12/1987 | Freeman et al. | 204/298 |
| 4,902,398 | 2/1990 | Homstad | . |
| 5,160,595 | 11/1992 | Hauzer et al. | . |
| 5,194,131 | 3/1993 | Anderson | 204/192.12 |
| 5,242,566 | 9/1993 | Parker | 204/298.2 |
| 5,272,417 | 12/1993 | Ohmi | 315/111.21 |
| 5,320,728 | 6/1994 | Tepman | 204/192.12 |
| 5,609,739 | 3/1997 | Aokura et al. | 204/298.19 |

FOREIGN PATENT DOCUMENTS

| | | |
|---|---|---|
| 0 441 368 A1 | 8/1991 | European Pat. Off. . |
| 0 451 642 A2 | 10/1991 | European Pat. Off. . |
| 7-166346 | 6/1995 | Japan . |

OTHER PUBLICATIONS

Rossnagel, "Deposition and redeposition in magnetrons," *J. Vac.Sci.Technol.* A 6(6) Nov./Dec. 1988 pp. 3049–3054.
Copy of Partial European Search Report dated Jun. 24, 1997.

Primary Examiner—Don Wong
Assistant Examiner—David H. Vu
Attorney, Agent, or Firm—Fish & Richardson P.C.

[57] ABSTRACT

A method for controlling the operation of a magnetron source for sputtering a surface of a target in a vacuum chamber, the method including the steps of: during a low pressure phase of sputtering, causing a magnetic field generated by a the magnetron source to be confined primarily to an inner region of the surface of the target so as to reduce leakage of electrons away from the target during sputtering; and during a subseguent high pressure phase of sputtering, causing the magnetic field generated by the magnet assembly to extend into the outer region of the surface of the target so as to sputter material from the outer region of the surface of the target. The pressure of the high pressure phase of sputtering is higher than the pressure of the low pressure phase of sputtering.

21 Claims, 4 Drawing Sheets

MAGNETRON FOR LOW PRESSURE FULL FACE EROSION

BACKGROUND OF THE INVENTION

The invention relates to magnetrons (e.g. planar magnetrons such as are used in plasma sputtering systems.

The term magnetron refers to magnets that are placed behind the cathode (e.g. the target) in the plasma systems The magnets produce B fields in the plasma discharge in front of the target. The term planar means that the magnets are aligned in a plane parallel to the target surfaces The magnetron source acts to increase the electron density in the plasma discharge. The magnets that are placed behind the target generate magnetic field lines, a portion of which are somewhat parallel to the face of the target. These magnetic field lines, along with E fields of the electric circuit create forces acting on the electrons which tend to trap them next to the surface of the target. This increases the probability of collisions with the gas (e.g. argon) atoms thereby producing more gas ions to bombard the target.

If the magnets are placed behind the target, nonuniform erosion of the target is likely to occur. Indeed, the erosion pattern that appears on the face of the target will identify the locations of the magnets behind the target. To prevent such nonuniform erosion patterns from developing, the magnet assembly is typically moved over the backside of the target so as to produce on average a substantially uniform magnetic field over the entire face of the target from its center to its outer edges. Achieving uniform erosion is particularly desirable for a number of reasons including prolonging target life and producing uniform bottom coverage during deposition of metal into high aspect ratio contact holes. Additionally, uniform sputtering ensures that all regions of the target are continuously eroded, thereby preventing material from back sputtering onto non-active (i.e., non-sputtered) areas and then flaking off.

Since the magnetron produces an increased sputtering efficiency, the chamber pressure can be reduced as compared to a system which does not use a magnetron source. The electrons trapped adjacent to the front of the target along magnetic field lines spaced from the target make up for the smaller number of potentialy ionized atoms present at low pressure by colliding with, and ionizing numerous of the gas atoms in the low pressure atmosphere. Low pressure operation can be particularly desirable because of its many positive benefits, including better contact hole filling due to lower gas scattering of the sputtered material and improved film properties, e.g. lower resistivity, higher density, greater stability, less contamination, etc.

Low pressure operation and uniformity in target erosion, particularly at the target's edge are, however, competing objectives Traditionally, low pressure operation is achieved by accepting less uniform target erosion. similarly, improved uniformity in target erosion typically results in having to operate at higher chamber pressures.

SUMMARY OF THE INVENTION

In general, in one aspect, the invention is a method for controlling the operation of a magnetron source for sputtering a surface of a target in a vacuum chamber. The method includes the steps of: (1) during a low pressure phase of sputtering in which the chamber is at a first pressure, causing a magnetic field generated by the magnet assembly to be confined primarily to an inner region of the surface of the target so as to reduce leakage of electrons away from the target during sputtering; and (2) during a subs egent high pressure phase of sputtering in which the chamber is at a second pressure, causing the magnetic field generated by the magnet assembly to extend into an outer region surrounding the inner region so as to sputter material from the outer region of the surface of the target.

In preferred embodiments, the low pressure phase uses a chamber pressure of less than 1 mTorr and the high pressure phase uses a chamber pressure of greater than 1 mTorr The step of causing the magnetic field to be confined primarily within the inner region of the target's surface involves sweeping the magnet assembly within a first area behind the target, wherein the first area is smaller than the area of the target's surface, and the step of causing the magnetic field to extend into the outer region of the targets surface involves sweeping the magnet assembly into a region that extends beyond the first area. The step of causing the magnetic field to extend into the outer region of the target involves causing the magnetic field to spend a larger portion of time in the outer region than it spends in the inner region. The low pressure phase of sputtering and the subsequent high pressure phase of sputtering are performed on the same substrate. Alternatively, the low pressure phase of sputtering is performed on a succession of different substrates before performing the high pressure phase of sputtering.

Also in preferred embodiments, the low pressure sputtering is performed on a substrate and the method further involves after the low pressure sputtering onto the substrate, inserting a shutter between the substrate and the target; and then performing the high pressure sputtering onto the shutter.

In general, in another aspect, the invention is a magnetron source for use in a plasma system for sputtering a surface of a target. The magnetron source includes a first magnet assembly which during use generates a magnetic field which over an area in front of the target is confined primarily to an inner region of that area, and a second magnet assembly which during use generates a magnetic field which over the area in front of the target is confined primarily to the outer region of the surface of the target.

Preferred embodiments have the following features. The second magnet assembly includes a plurality of magnets positioned around a perimeter of the first magnet assembly, and it includes a lift mechanism to which the plurality of magnets are connected. During operation, the lift mechanism raises and lowers the plurality of magnets so as to decrease and increase, respectively, the magnetic field in the outer region. The lift mechanism includes one or more actuators to which the plurality of magnets are connected. The magnetron source also includes a motor which rotates the first magnet assembly during operation. The first magnet assembly includes a shaft by which the first magnet assembly is rotated and output of the motor is coupled to the shaft through a drive belt or direct drive.

In accordance with the invention, the magnetron source which utilizes a magnet assembly that is smaller than the area of the target, has two modes of operation. During an initial deposition mode of operation (e.g. to coat the bottoms of the contact holes) which is performed at low total chamber pressure (e.g. <1 mTorr), the magnet assembly is moved so that the magnetic field sweeps over and is confined within an inner region of the target. Since the magnetic field is thereby kept away from the grounded shield and other hardware near the perimeter of the target, stable low pressure operation is possible. During a subsegent deposition or cleaning modes, which is performed at high total chamber pressure (e.g. >1 mTorr), the magnet assembly is moved so that the magnetic field sweeps out to the edge of the target (i.e., into the outer region surrounding the inner region). Since a higher chamber pressure is used, the magnetic field can be brought closer to the edge of the target without destabilizing the plasma. Thus, in the high pressure mode of operation, it becomes possible to sputter the outer region of the target. The high pressure mode of operation can be used to create a more uniform thickness of the deposited layer on the substrate or, alternatively, it can be performed as a target cleaning step on a shutter after the substrate has been removed from the chamber.

By operating in the low pressure mode followed by the high pressure mode, it becomes possible to achieve a full target erosion while still obtaining the advantages of a low pressure plasma deposition.

Other advantages and features will become apparent from the following description of the preferred embodiment and from the claims.

DESCRIPTION OF THE PREFERRED EMBODIMENTS

Figure 1:
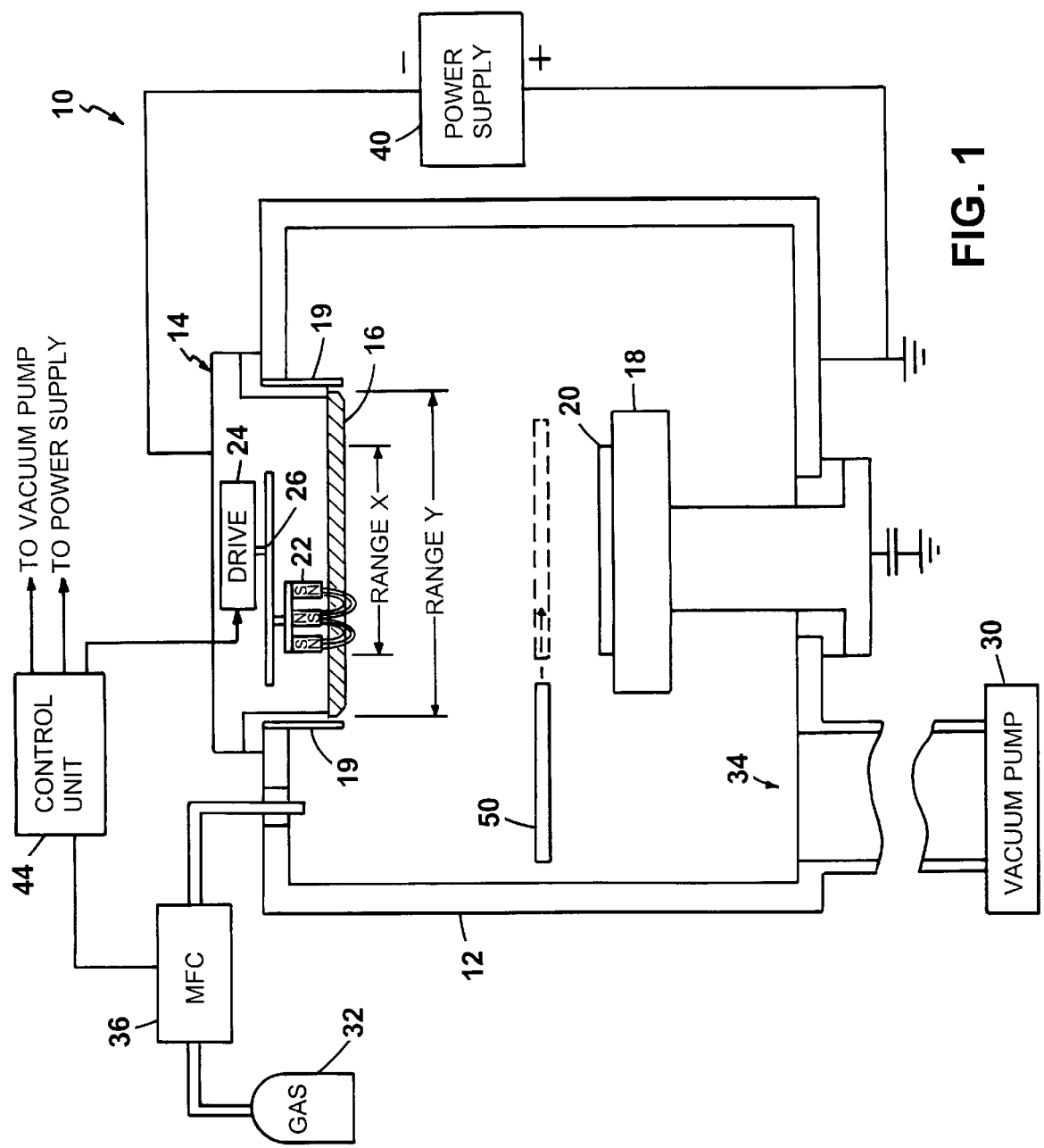
FIG. 1 shows a block diagram of a sputter deposition chamber that includes a magnetron source constructed in accordance with the invention.

Referring to FIG. 1, a sputter deposition system 10 constructed in accordance with the invention includes a vacuum chamber 12 with a dual mode, planar magnetron source 14, a sputter target 16 which i s attached to the magnetron source, and a pedestal 18 for holding a substrate 20 (e.g. semiconductor wafer) onto which material that is sputtered from target 16 is to be deposited. Magnetron source 14, which is surrounded by a grounded shield 19, includes a magnet assembly 22 that is swept over the backside of target 16, a drive unit 24 (e.g. motor) and coupling mechanism 26 to move the magnet assembly over predefied paths in back of the target. The area of magnet assembly 22 (e.g. the area of the projection of the magnets onto the surface of the target) is smaller than the area of target 16 so that the magnetic field that is generated by the magnet assembly can be constrained to be within an internal region of the target that is smaller than the target.

Target 16 is made of whatever material that is to be deposited onto the substrate. For example, it could be aluminum if an aluminum metalization layer is to be deposited, it could be titanium or titanium nitride if a contact or barrier layer is to be deposited onto the bottoms of contact holes, or it could be tungsten, just to name a few possibilities.

The deposition system also includes other equipment that is commonly found in plasma deposition systems. For example, it includes a vacuum pump 30 and a source of process gas 32 (e.g. Argon). Vacuum pump 30, which is connected to chamber 12 through an output port 34, serves to evacuate the chamber to achieve the vacuum levels that are desired for sputtering. Source of gas 32 is connected to chamber 12 through a mass flow controller 36 which controls the rate of flow of process gas into the chamber, thereby controlling the total pressure in the chamber.

A D.C. power supply 40 connected between the target and the pedestal delivers the power that is necessary to generate a plasma during operation. The supply biases target 16 negatively with respect to an electrically floating pedestal 18 and chamber 12 connected to ground.

A programmable control unit 44 controls the overall operation of the system, including the operation of mass flow controller 36, drive unit 24 within magnetron source 14, power supply 40, and vacuum pump 30. That is, it is programmed to fully automate the deposition and cleaning processes which will now be described.

In accordance with the invention, control unit 44 operates magnet assembly 22 in one of two selectable two modes, namely, a low pressure mode and a high pressure mode. For reasons which will become apparent shortly, in the described embodiment, the low and high pressure modes are also referred to, respectively, as the deposition and cleaning modes.

In the low pressure mode, which takes place at a total chamber pressure that is low in comparison to the high pressure mode, the drive unit sweeps the magnet assembly over a limited central region of the backside of the target so as to cause the magnetic field that is produced by the magnet assembly to be confined within an internal region of the target face. During this period of operation, the magnetic field that is produced by the magnet assembly is not permitted to sweep out into an outer region of the target and thus is kept away from the outer edge of the target. In other words, the magnetic field lines are maintained on the face of the target during the low pressure mode of operation and none of the electrons that become trapped along the magnetic field lines will leak into the grounded shield surrounding the target.

In the high pressure mode, which takes place at a total chamber pressure that is high in comparison to the low pressure mode, the drive unit moves the magnet assembly over the backside of the target so that the magnetic field sweeps out to the edge of the target.

In FIG. 1 the two different ranges of operation are shown diagrammatically by two regions, a smaller region labeled "RANGE "X" and a larger region labeled "RANGE Y". During the low pressure mode, the magnetic field is swept over RANGE X and during the high pressure mode, the magnetic field is swept over RANGE Y, or alternatively over the region of the target outside of RANGE X.

During low pressure operation the electrons have longer path lengths between collisions and thus they are more likely to reach the grounded shield that surrounds the target. The electrons which reach the grounded shield (or other grounded portions of the deposition chamber) will constitute a leakage current away from the plasma and are lost to the sputtering process. It is these leakage currents which can greatly reduce sputtering efficiency and, if large enough, can result in unstable plasma operation, even an inability to strike a plasma. By keeping the magnetic field that is in front of the target away from the shield or other grounded regions during low pressure operation, the leakage currents do not become a problem and stable operation is possible.

However, when the movement of the magnet assembly is confined to the inner region, then the outer perimeter region of the target is not eroded at the same rate as the inner region. In addition, a build up of sputtered target material is also likely to occur in the outer region further enhancing the nonuniformity in target erosion. It is particularly desirable to limit the amount of redeposition buildup that is permitted to occur at the edge of the target. Such a buildup of redeposited material can flake off during sputtering and contribute to particle contamination on the substrates The subsequent high pressure mode deposition or cleaning step, compensates for the target nonuniformity produced by the low pressure deposition and removes the redeposition buildup at the edge of the target. During the high pressure mode, the magnet assembly can be brought closer to the edge of the target without causing electron leakage to the shield and without destabilizing the plasma. Thus, in the high pressure mode, the outer region of the target can be preferentially sputtered by concentrating the motion of the magnet assembly to the outer region of the target.

For processing 8 inch wafers, target size is typically 10–13 inches. In the described embodiment, which uses a 13 inch target, the inner region is 12 inches in diameter and the outer region is a 1 inch annular ring surrounding the inner region. Note that the difference between the cuter perimeter of inner region and the cuter perimeter of the target need not be very large. The key requirement is that the outer boundary of the inner region be far enough away from the outer edge of the target to prevent the trapped electrons from contacting conductive areas outside of the target and thereby creating a leakage path allowing the electrons to escape from the magnetic field and the face of the target. Stated another way, the magnetic field lines produced by the magnet assembly enabling electron trapping should not intersect the grounded shield or other conductive regions outside of the target. Of course, the exact spacing depends on magnetic field strength and the magnet configuration that is used.

In the described embodiment, the low pressure operation is performed in the sub millitorr region (e.g. <1 mTorr) and the high pressure operation is performed using pressures above 1 mTorr (e.g. 1–5 mTorr). All other conditions e.g. voltage, flow rates, durationing etc., are typical of those by persons skilled in the art and reflect the objectives of the particular deposition being conducted.

Figure 2A:
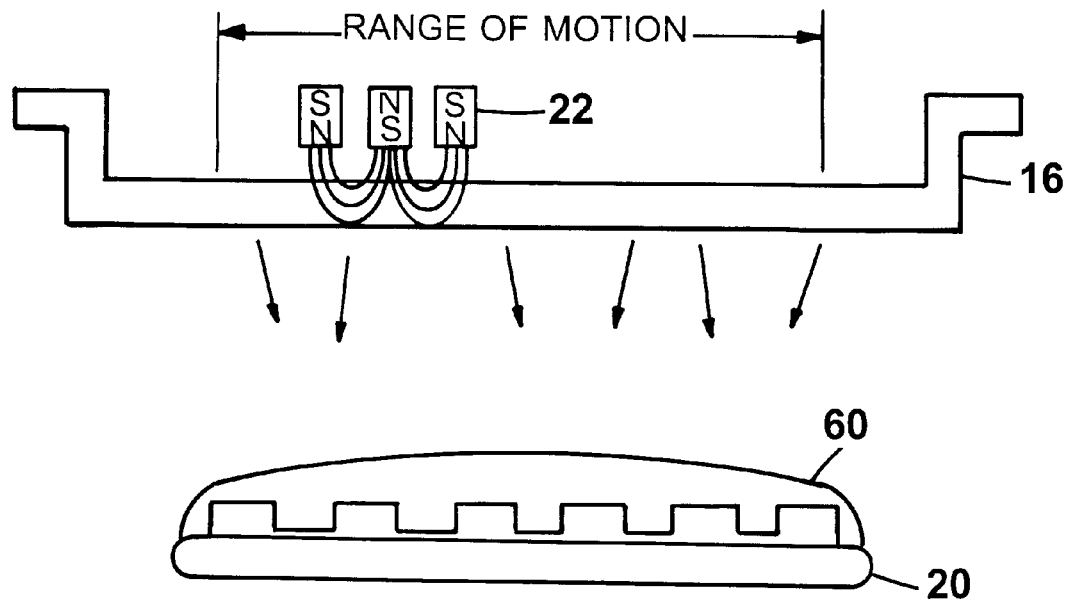
FIGS. 2A–B illustrate the low and high pressure modes of operation in a deposition process.
Figure 2B:
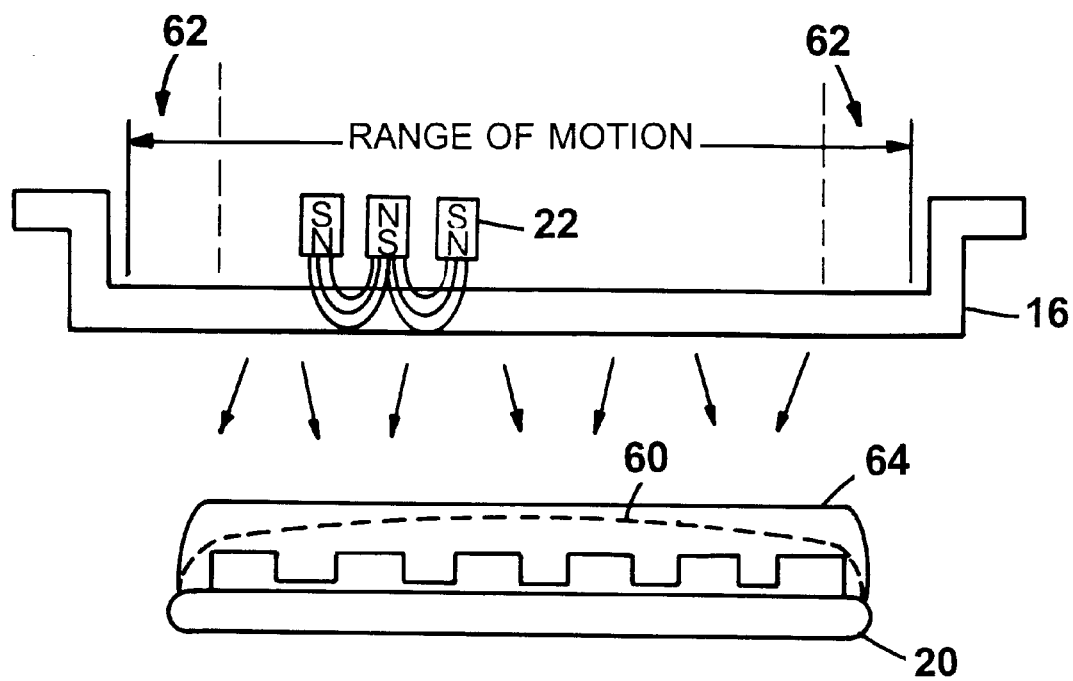

FIGS. 2A–B illustrate use of dual mode operation for depositing a metalization layer onto substrate 20. The elements corresponding to those shown in FIG. 1 are identified by like numbers.

During a low pressure deposition, illustrated by FIG. 2A, the range of motion of magnet assembly 22 is limited to the center area of the target and kept away from the edge of the target. During this phase of deposition, more material 60 will tend to be deposited onto the central area of the substrate than on regions near the perimeter of the substrate. After the low pressure deposition is complete and without exposing the inside of the chamber to atmospheric pressure, the pressure in the chamber is increased to levels that are appropriate for a high pressure deposition. When the chamber pressure reaches the desired level, a high pressure deposition is then performed in which the motion of the magnet assembly is extended out to the edge of the target as shown in FIG. 2B. If the magnet assembly is allowed to spend a greater portion of its time near the outer region 62 of the target, then more material 62 will tend to be deposited near the perimeter of the substrate. The net result of the low pressure deposition followed by the high pressure deposition will be a more uniform metalization layer over the surface of the substrate.

It may be desirable, however, to not expose the substrate to a high pressure deposition phase at all. In that case, the substrate can be removed from the chamber after the low pressure deposition is complete and a shutter 50 (see FIG. 1) can be inserted between the target and the platform Then a high pressure deposition can be performed onto the shutter for the purpose of "cleaning" the target and in general compensating for the nonuniform target erosion caused by the low pressure deposition.

One should also understand that it may be desirable to perform multiple low pressure depositions before performing the high pressure cleaning step. Thus, for example, a sequence of wafers can be deposited using the low pressure mode of operation. After the $n^{th}$ wafer (e.g. the fifth or the tenth), the high pressure mode of operation is then performed to clean and level the target.

In the described embodiment shown in FIG. 1, a small puck magnet assembly (i.e. much smaller than the size of the target) is moved around the center region of the target. Alternatively, one may instead use a more complex, larger magnet assembly such as is described U.S. Pat. No. 5,242,566 by Norman W. Parker, entitled "Planar Magnetron Sputtering Source Enabling a Controlled Sputtering Profile Out to the Target Perimeter," incorporated herein by reference.

Figure 3:
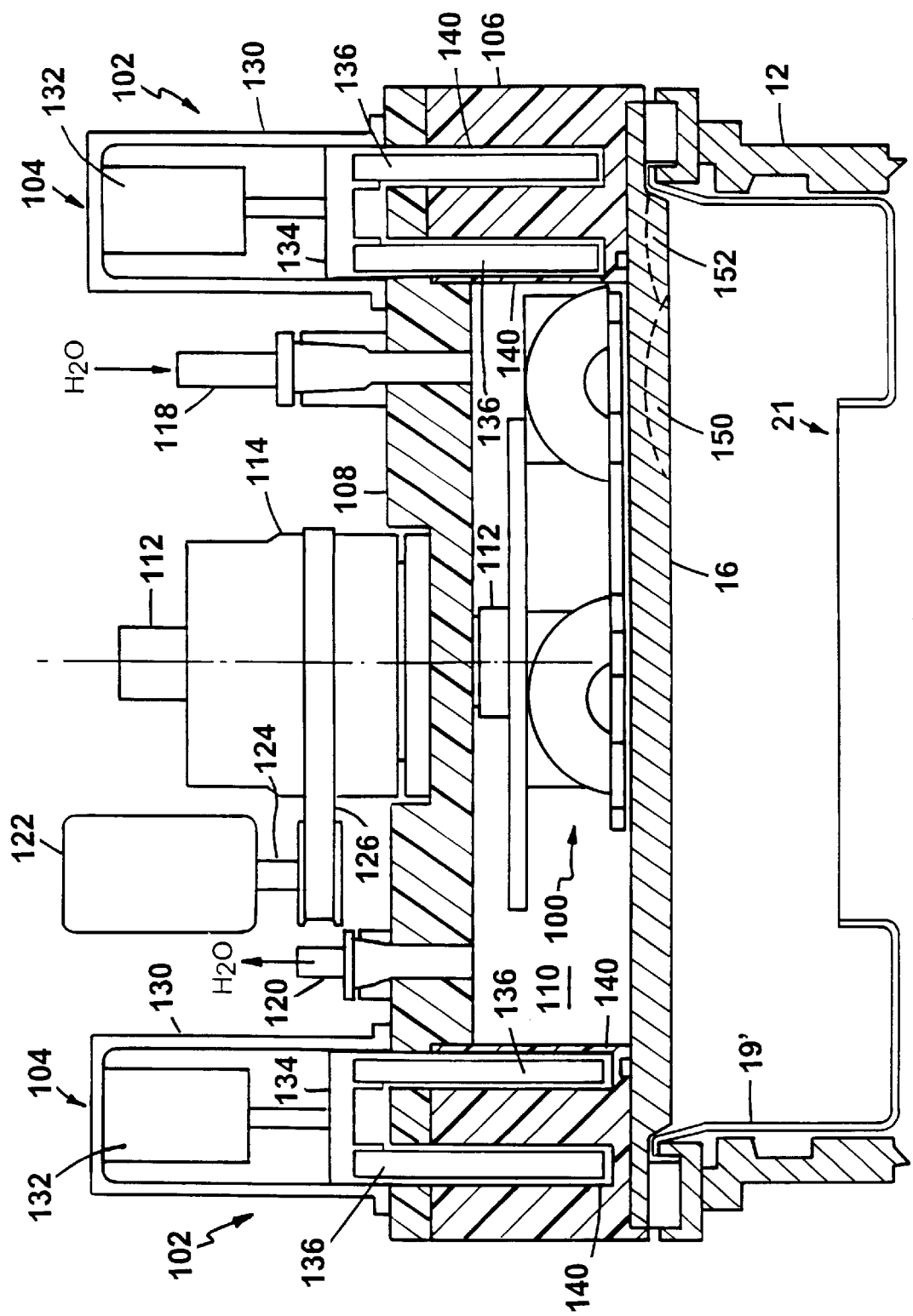
FIG. 3 shows a schematic representation of an alternative embodiment of a magnetron source.
Figure 4:
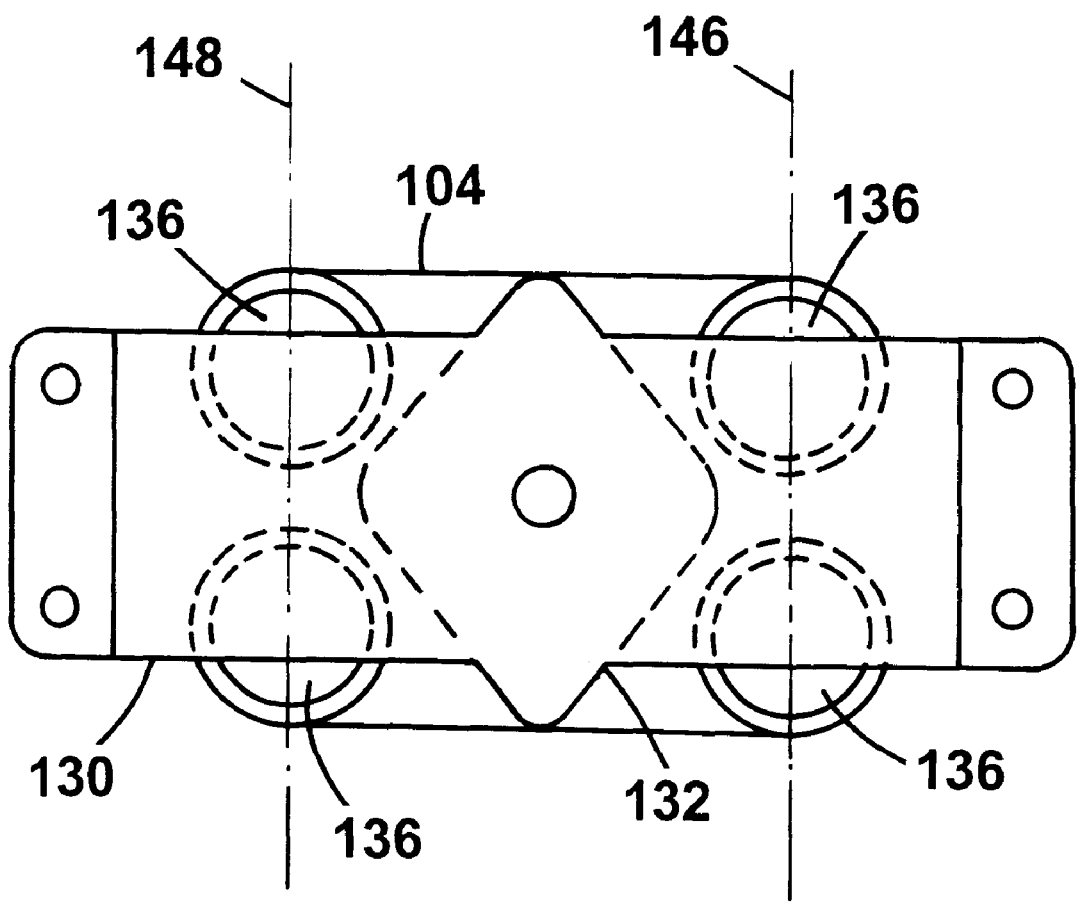
FIG. 4 is a top view of a magnetron source showing an array of movable magnet elements.

Rather than using a single magnet assembly as described above, an alternative approach, which is illustrated in FIG. 3, uses two magnet assemblies—one magnet assembly produces the magnetic field for low pressure operation and the combination of the two magnet assemblies produces the magnetic field for high pressure operation. In other words, one of the magnet assemblies produces the magnetic field in the inner region of the face of the target and the other magnet assembly produces the magnetic field in the outer perimeter region of the face of the target. In this alternative embodiment, the magnet assembly which produces the field in the inner region is a rotating inner magnet assembly 100 and the magnet assembly which produces the magnetic field in the outer perimeter region is a non-rotating outer magnet assembly 102 that surrounds inner magnet assembly 100.

Inner magnet assembly 100 is sized and configured so that as it rotates the magnetic field that it produces sweeps over the face of target 16 within the previously-mentioned inner region. Inner magnet assembly 100 can be of a known design such as, for example, are described in U.S. Pat. No. 5,320,728 and in the previously-mentioned U.S. Pat. No. 5,242,566, both of which are incorporated herein by reference.

A cylindrical body 106, which has a top plate 108 covering its upper end, is mounted on top of target 16 and forms a cavity 110 which houses inner magnet assembly 100. A drive shaft 112 with its lower end coupled to inner magnet assembly 100 passes up through top plate 108 and has a pulley 114 mounted on its upper end. Top plate 108 also includes an inlet port 118 and an outlet port 120 through which coolant (e.g. water) is pumped into internal cavity 110 to cool inner magnet assembly 100 and target 16 during plasma sputtering.

A grounded, generally cylindrically-shaped shield 19' surrounds the inside of the chamber and extends up close to target 16. The upper end of shield 19', near target 16, tapers outward slightly This makes it possible to extend the target as close to the shield as possible while at the same time still being able to tilt the top open to access the chamber. The lower end of shield 19' includes an annular portion defining an opening through which sputtered material can pass to deposit onto the substrate (not shown).

A motor 122, which is mounted above top plate 108, has its output shaft 124 coupled to pulley 114 through a drive belt 126 that is made of an electrically insulating material (e.g. rubber) Motor 122 rotates inner magnet assembly 100 during operation and drive belt 126 assures that inner magnet assembly 100 remains electrically isolated from motor 122.

A plurality of individual magnet subassemblies 104 which make up the larger outer non-rotating magnet assembly 102 are mounted at evenly spaced distances around the outer perimeter of top plate 108. In the described embodiment, which is for processing eight inch wafers there are thirty such magnet subassemblies 104.

Each of magnet assemblies 104 includes a U-shaped bracket 130 that holds a pneumatically operated solenoid 132 that raises and lowers a base plate 134 to which four vertically oriented rod magnets 136 are attached. The four rod magnets 136 of each magnet subassembly 104 are arranged at four corners of a rectangle as shown in FIG. 40 Holes 140 that are drilled through top plate 108 and into cylindrical body 106 are aligned with and receive rod magnets 136 when the individual magnet assemblies 104 are assembled onto top plate 108. In other words there are four holes 140 for each magnet sub assembly 104. Two of the holes 140 are located along an inner circle 146 that is centered on the axis of drive shaft 112 and the remaining two holes are located long a larger outer circle 148 that is concentric with inner circle 146.

In each magnet subassembly 104, solenoid 132 toggles between two positions, namely, a fully retracted position and a fully extended position. When the solenoid is in its fully retracted position, rod magnets 136 are pulled up towards solenoid 132 and further away from the face of target 16. Then the solenoid is in its fully extended position, rod magnets 136 are pushed fully down into the holes so that their lowermost ends are close to the face of target 160. In their fully retracted positions, the high flux portion of the magnetic field that is produced by rod magnets 136 is in back of the target and does not significantly affect the sputtering process that is taking place at the face of the target. In their fully extended positions, the high flux portion of the magnetic field that is produced by rod magnets is located right in front of the face of target 16 where it has maximum affect on the sputtering process that takes place there.

In this embodiment, the outer perimeter region has a radial width that is greater than about 1 mm. For chamber sputtering pressures in the millitorr range (e.g. down to about 0.4 mTorr), a width of about 25–50 mm is acceptable. It is desirable, however, to avoid making this outer perimeter region too wide, since that would result in less of the face of target 16 participating in the low pressure sputtering process.

Rod magnets 136 are made of a strongly magnetic material. They can be made of any of a variety of commonly used materials such as ceramic, neodymium boron, or samarium cobalt, just to name a few. Rod magnets 136 can be made entirely of the magnetic material or alternatively they can be made of a steel bar with its lowermost end made of the magnetic material. It is also desirable, however, that the magnets that are used in inner magnet assembly 100 be made of the same type of material as that used in rod magnets 136. In other words, all magnets are selected to be equally strong so that there is less likelihood that one set of magnets will act to demagnetize the other set of magnets.

In the described embodiment, base plates 134 are made of steel thereby forming a high magnetic permeability path for the magnetic flux from the rod magnets 136. This serves the important function of increasing the magnetic flux density between the free ends of the rod magnets.

Indeed, an alternative approach would be to raise and lower only the base plate and leave the rod magnets in a permanent lowered position with their ends close to the target. When the base plate is raised, it does not act as an effective shunt and the magnetic flux density near the face of the target would be attenuated. When the base plate is lowered, it acts as an effective shunt for the rod magnets and the magnetic flux density near the face of the target in the perimeter region would be enhanced.

During low pressure sputtering, the solenoids of outer magnet assembly 102 are held in their fully retracted condition so that the magnetic field at the face of the target does not extend out to the edge of the target. If sputtering is allowed to take place under these conditions, the target will erode as shown by dashed line 150 in FIG. 3, i.e., the edge of the target will not erode significantly. To erode the edge of the target and thus to clean up the target, the solenoids are switched to their fully extended condition and sputtering is performed using higher chamber pressures, as previously described. In that case, the erosion pattern that will result from the outer magnet assembly is illustrated by dashed line 152. As should be apparent, by properly using these two modes of operation, it should be possible to achieve a relatively uniform face erosion of the target and to keep the target clean.

How often the outer magnets should be lowered to clean the edge of the target depends on the process that is being performed in the chamber. One indicator of how frequently it should be used will be the particle contamination that is generated in the chamber if particle contamination goes up, that is an indication that the magnets of the outer magnet assembly should be lowered more frequently for high pressure sputtering to clean the outer perimeter of the target. Typically, one might start by lowering the outer magnets once every 500 process runs. If it appears that particle contamination is increasing, then the magnets can be lowered more frequently.

Though we have described the outer assembly as non-rotating it could just as well be a rotating assembly like the inner assembly. Of course, in that case, the mechanical design would be more complex.

Also, it should be understood that the plasma chambers described above and shown in FIGS. 1 and 3 are merely illustrative. The dual mode magnetron sources that have been described can be used in a wide range of alternative deposition system configurations and designs. For example, the deposition system might include additional power supplies, one of which could be used to bias the platform (and this the substrate) during processing. In addition, it may be desirable to include a collimation filter disposed between the target and the substrate to produce a coherent deposition, as described in U.S.S.N. 08/145,744, entitled Collimation Hardware with RF Bias Rings to Enhance Sputter and/or Substrate Cavity Ion Generation Efficiency, filed Oct. 29, 1993, and incorporated herein by reference. It also might be desirable to include one or more internal antennae within the chamber to achieve greater control over the plasma and the deposition process, such as is also described in U.S.S.N. 08/145,744. Furthermore the power supplies could be RF supplies rather than D.C. supplies.

It should also be understood that the system can include many other features which are not shown in FIG. 1. For example, the system, might also include a robot for loading and removing wafers from the chamber, a lift mechanism for raising and lowering the pedestal, and a motor operated slit valve providing access to the inside of the chamber. Since such other features are of secondary importance with respect to the magnetron source, it is not necessary to describe them here in any greater detail.

What is claimed is:

1. A method for controlling the operation of a magnetron source for sputtering a surface of a target in a vacuum chamber, said magnetron source including a magnet assembly, said method comprising:

during a low pressure phase of sputtering in which the chamber is at a first pressure, causing a magnetic field generated by the magnet assembly to be confined primarily to an inner region of the surface of the target so as to reduce leakage of electrons away from the target during sputtering, said inner region being surrounded by an outer region; and during a subsequent high pressure phase of sputtering in which the chamber is at a second pressure, causing the magnetic field generated by the magnet assembly to extend into said outer region of the surface of the target so as to sputter material from the outer region of the surface of the target, wherein the second pressure is higher than the first pressure.

2. The method of claim 1 wherein the low pressure phase uses a chamber pressure of less than 1 mTorr and the high pressure phase uses a chamber pressure of greater than 1 mTorr.

3. The method of claim 1 wherein the step of causing the magnetic field to be confined primarily within the inner region of the target's surface comprises sweeping said magnet assembly within a first area behind the target, wherein said first area is smaller than the area of the target's surface.

4. The method of claim 1 wherein the step of causing the magnetic field to be confined primarily within the inner region of the targets surface comprises sweeping said magnet assembly within a first area behind the target, and wherein the step of causing the magnetic field to extend into said outer region of the targets surface comprises sweeping the magnet assembly into a region that extends beyond said first area.

5. The method of claim 4 wherein the step of causing the magnetic field to extend into said outer region of the target comprises causing the magnetic field to spend a larger portion of time in the outer region than it spends in the inner region.

6. The method of claim 1 wherein the low pressure phase of sputtering and the subsequent high pressure phase of sputtering are performed on the same substrate.

7. The method of claim 1 wherein the low pressure phase of sputtering is performed on a succession of different substrates before performing the high pressure phase of sputtering.

8. The method of claim 1 wherein the low pressure sputtering is performed on a substrate and further comprising:

after the low pressure sputtering onto the substrate, inserting a shutter between the substrate and the target; and then performing the high pressure sputtering onto the shutter.

9. The method of claim 1 wherein the magnet assembly has an inner magnet assembly which is used to generate a magnetic field in the inner region and an outer magnet assembly which is used to generate a magnetic field in the outer region and wherein the step of causing the magnetic field generated by the magnet assembly to be confined primarily to the inner region of the surface of the target comprises reducing the magnetic field that is generated at the face of the target by the outer magnet assembly relative to the inner magnet assembly.

10. The method of claim 9 wherein the step of reducing the magnetic field that is generated at the face of the target by the outer magnet assembly comprises moving the outer magnet assembly farther away from the face of the target.

11. The method of claim 1 wherein the magnet assembly has an inner magnet assembly which is used to generate a magnetic field in the inner region and an outer magnet assembly which is used to generate a magnetic field in the outer region and wherein the step of causing the magnetic field generated by the magnet assembly to extend into said outer region of the surface of the target comprises increasing the magnetic field that is generated at the face of the target by the outer magnet assembly relative to the inner magnet assembly.

12. The method of claim 11 wherein the step of increasing the magnetic field that is generated at the face of the target by the outer magnet assembly comprises moving the outer magnet assembly closer to the face of the target.

13. A method for controlling the operation of a magnetron source for sputtering a surface of a target in a vacuum chamber, said magnetron source including a magnet assembly that produces a magnetic field, said method comprising:

sputtering the target while maintaining a low chamber pressure;

throughout the low pressure sputtering, confining the magnetic field to an inner region of the surface of the target so as to reduce leakage of electrons away from the target during sputtering, said inner region of the surface of the target being surrounded by an outer region of the surface of the target;

after the low pressure sputtering, sputtering the target using a high chamber pressure; and during the high pressure sputtering, causing the magnetic field to extend into said outer region of the surface of the target so as to sputter material from the surface of target in the outer region, wherein the high chamber pressure is greater than the low chamber pressure.

14. The method of claim 13 wherein the step of causing the magnetic field to be confined primarily within the inner region of the target's surface comprises sweeping said magnet assembly within a first area behind the target, and wherein the step of causing the magnetic field to extend into said outer region of the target's surface comprises sweeping the magnet assembly into a region that extends beyond said first area.

15. The method of claim 14 wherein the step of causing the magnetic field to extend into said outer region of the target comprises causing the magnetic field to spend a larger portion of time in the outer region than it spends in the inner region.

16. The method of claim 14 wherein the low pressure sputtering and the subsequent high pressure sputtering are performed on the same substrate.

17. The method of claim 14 wherein the low pressure sputtering is performed on a succession of different substrates before performing the high pressure sputtering.

18. The method of claim 14 wherein the high pressure sputtering is performed after removing all substrates from the chamber.

19. A plasma system for sputtering a surface of a target, said apparatus comprising:

a chamber;

a magnetron source for holding the target in the chamber during processing, said magnetron source producing a magnetic field next to the surface of the target;

a platform within the chamber which supports a substrate during processing;

a programmed control unit controlling the magnetron source, said control unit programmed to perform the following steps:

during a low pressure phase of sputtering, causing the magnetic field generated by the magnetron source to be confined primarily to an inner region of the surface of the target so as to reduce leakage of electrons away from the target during sputtering said inner region being surrounded by an outer region; and during a subsequent high pressure phase of sputtering causing the magnetic field generated by the magnetron source to extend into said outer region of the surface of the target so as to sputter material from the outer region of the surface of the target, wherein the high pressure phase uses a chamber pressure that is higher than a chamber pressure of the low pressure phase.

20. The plasma system of claim 19 further comprising:

a power supply which during operation delivers the power that is necessary to produce a plasma between the target and the substrate on the platform;

a flow controller which during operation controls a flow of gas from a source of gas into the chamber; and a vacuum pump connected to the chamber, said vacuum pump evacuating the chamber during operation;

wherein the control unit is programmed to control operation of the power supply, the flow controller and the vacuum pump so as to perform the low pressure and high pressure phases of sputtering.

21. The plasma system of claim 19 wherein the magnetron source comprises a movable magnet assembly and a drive unit which moves the magnet assembly behind the target, and wherein the control unit causes the drive unit to sweep the magnet assembly behind the target so as to produce the magnetic fields required during the low pressure and high pressure phases of operation.

* * * * *